US006483732B2

(12) United States Patent  
Gray

(10) Patent No.: US 6,483,732 B2  
(45) Date of Patent: Nov. 19, 2002

(54) RELATIONAL CONTENT ADDRESSABLE MEMORY

(75) Inventor: Kenneth S. Gray, Jericho, VT (US)

(73) Assignee: Koninklijke Philips Electronics N.V., Eindhoven (NL)

(*) Notice: Subject to any disclaimer, the term of this patent is extended or adjusted under 35 U.S.C. 154(b) by 26 days.

(21) Appl. No.: 09/736,498

(22) Filed: Dec. 13, 2000

(65) Prior Publication Data

US 2002/0105821 A1 Aug. 8, 2002

(51) Int. Cl.⁷ .............................................. G11C 15/00
(52) U.S. Cl. ................... 365/49; 365/365; 365/189.01; 365/230.1; 711/108
(58) Field of Search ............................. 365/49, 189.01, 365/230.01, 711, 108

(56) References Cited

U.S. PATENT DOCUMENTS

| | | | | |
|---|---|---|---|---|
| 3,601,812 A | * | 8/1971 | Weisbecker | 340/172.5 |
| 4,153,943 A | | 5/1979 | Anderson | 364/900 |
| 4,162,535 A | | 7/1979 | Anderson | 364/900 |
| 4,283,771 A | | 8/1981 | Chang | 364/900 |
| 4,376,974 A | | 3/1983 | Stewart et al. | 364/200 |
| 4,996,666 A | | 2/1991 | Duluk, Jr. | 365/49 |
| 5,258,946 A | | 11/1993 | Graf | 365/49 |
| 5,444,649 A | | 8/1995 | Nemirovsky | 365/49 |
| 5,475,794 A | | 12/1995 | Mashiko | 395/24 |
| 5,502,832 A | | 3/1996 | Ali-Yahia et al. | 395/435 |
| 5,592,142 A | | 1/1997 | Adams et al. | 340/146.2 |
| 5,694,406 A | | 12/1997 | Lipovski | 371/51.1 |
| 5,796,758 A | * | 8/1998 | Levitan | 371/49.1 |
| 5,930,161 A | | 7/1999 | Sheikholeslami | 365/49 |
| 5,953,714 A | * | 9/1999 | Abdullah | 707/3 |
| 6,137,707 A | | 10/2000 | Srinivasan et al. | 365/49 |
| 6,161,164 A | * | 12/2000 | Dhong et al. | 711/108 |

* cited by examiner

Primary Examiner—David Nelms  
Assistant Examiner—Connie C. Yoha  
(74) Attorney, Agent, or Firm—Peter Zawilski

(57) ABSTRACT

Disclosed are methods and apparatus for providing a relational operation with a content addressable memory (24). One form includes providing a multibit input to a content addressable memory location (30) and generating a relational state bit output corresponding to an arithmetic relationship between the input and the memory location (30). A first bit of the input or a complement of it is routed to the output if the first bit and most significant bit of the location are unequal. If the first bit and the most significant bit are equal, a second bit of the input or its complement is routed to the output if the second bit and next most significant bit of the location are unequal. A relational logic circuit (52) is included for each memory cell (40) of the location (30) to provide the relational operation.

26 Claims, 2 Drawing Sheets

RELATIONAL CONTENT ADDRESSABLE MEMORY

BACKGROUND

The present invention relates to electronic circuitry, and more particularly, but not exclusively, relates to relational logic for a content addressable memory.

Content addressable memory (CAM) is used in many different applications, such as redundant "back-up" memory systems for Application Specific Integrated Circuits (ASICs), associative caches, and databases. In common use, an input is compared to each CAM memory location and any matches are identified. Some systems have incorporated schemes to provide relational information as an alternative or addition to match status. Unfortunately these schemes typically involve the addition of a significant amount of circuitry and/or processing time. Accordingly, there is a demand for further advancements relating to CAM technology. The present invention satisfies this demand and has other benefits and advantages.

SUMMARY OF THE INVENTION

One embodiment of the present invention is a unique content addressable memory system. Other embodiments include unique devices and methods involving relational operations for a content addressable memory.

In a further embodiment, a Content Addressable Memory (CAM) device includes unique logic to provide an indication corresponding to an inequality between an input and one or more locations. The inequality corresponds to a greater-than, greater-than-or-equal-to, less-than, or less-than-or equal-to relational operation.

Another form of the present application includes a number of content addressable memory cells and a number of relational logic circuits. The circuits each compare a stored bit of one of the cells to a respective bit of an input word. The relational logic circuits each include a selection operator to route a first signal input to a respective output if the stored bit and respective bit are equal and to route a second signal representative of a relational inequality between the word and data stored in the cells to the output if the stored bit and the respective bit are unequal.

In another embodiment of the present invention, an apparatus includes a number of content addressable memory cells and a number of relational logic circuits each corresponding to a different one of the cells. Each one of these circuits is coupled to another by a corresponding one of a number of relational signal pathways, and each include a device with an input coupled to one of these pathways and an output coupled to another of these pathways to selectively pass a signal from the input to the output in response to a control signal.

Yet another embodiment comprises operating a content addressable memory that includes a multibit storage location, first relational logic corresponding to a most significant bit of the location, and second relational logic corresponding to a next most significant bit of the location. A multibit input to the memory is provided and a first signal is selected for output with the first relational logic if a first bit of the input and the most significant bit of the location are different. A second signal is selected for output with the first relational logic if the first bit of the input and the most significant bit of the location are equal. This second signal is received from the second relational logic.

Accordingly, one object of the present invention is to provide a unique content addressable memory.

Another object is to provide a unique system, method, or apparatus directed to relational operation of a content addressable memory.

Further, objects, embodiments, forms, benefits, aspects, features, and advantages of the present invention can be obtained from the description and drawings provided herein.

DETAILED DESCRIPTION OF THE PREFERRED EMBODIMENTS

Figure 1:
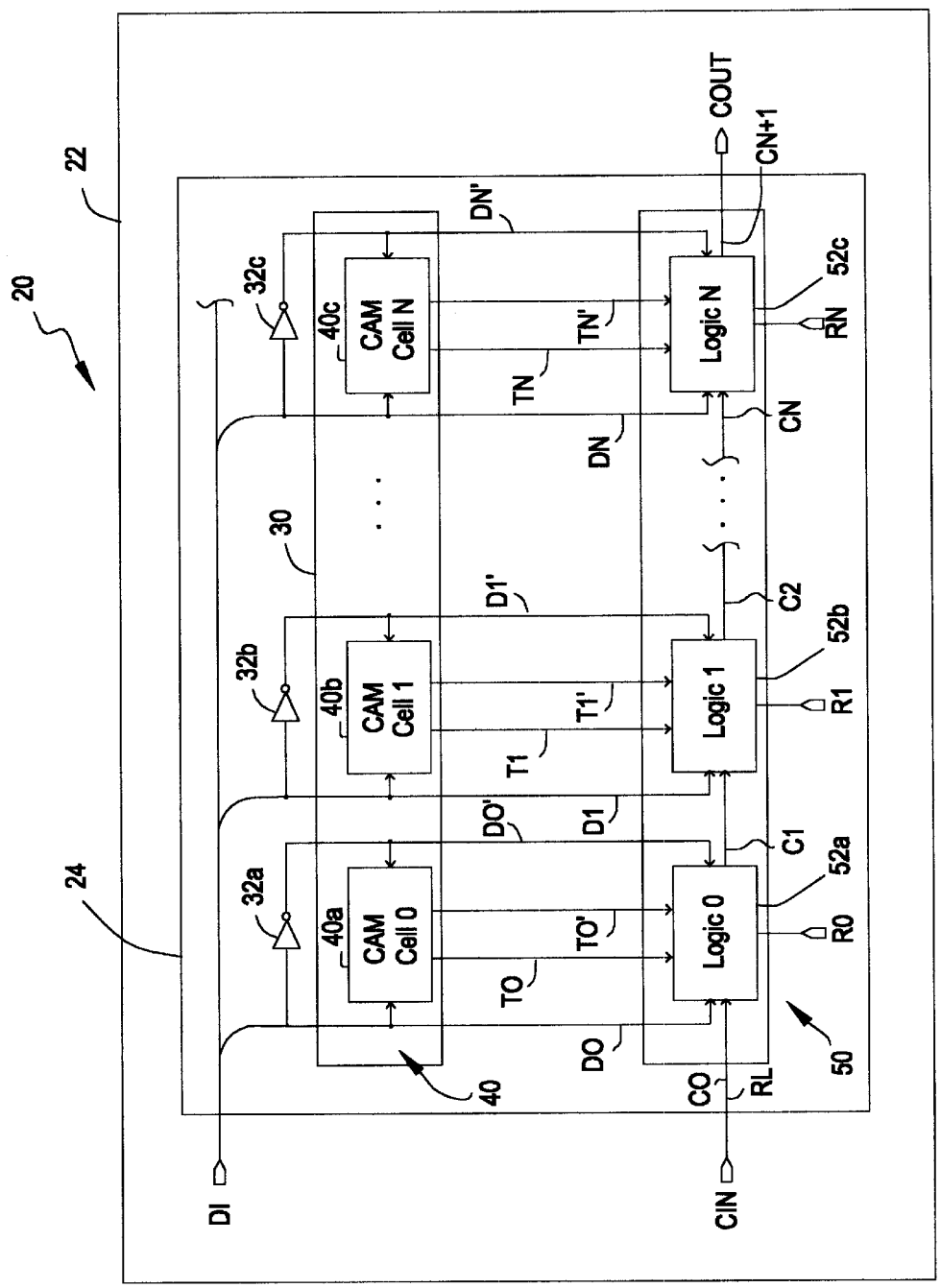
FIG. 1 a schematic view of a system of one embodiment of the present invention.

While the present invention may be embodied in many different forms, for the purpose of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

FIG. 1 depicts electronic system 20 of one embodiment of the present invention. System 20 includes Integrated Circuit (IC) 22. Integrated circuit 22 includes a Content Addressable Memory (CAM) 24. Only a representative portion of content addressable memory 24 is illustrated in FIG. 1 to preserve clarity. In one example, IC 22 is of the Application Specific Integrated Circuit (ASIC) variety where at least a portion of the circuitry for IC 22 is defined through a Hardware Development Language (HDL) such as Verilog or VHDL. HDL may be utilized to specify an arrangement of standard logic cell types through one more macros to define a desired logical structure, such as a CAM cell. As used herein, a "macro" refers to a logical module described in terms of one or more HDL defined cells.

Figure 2:
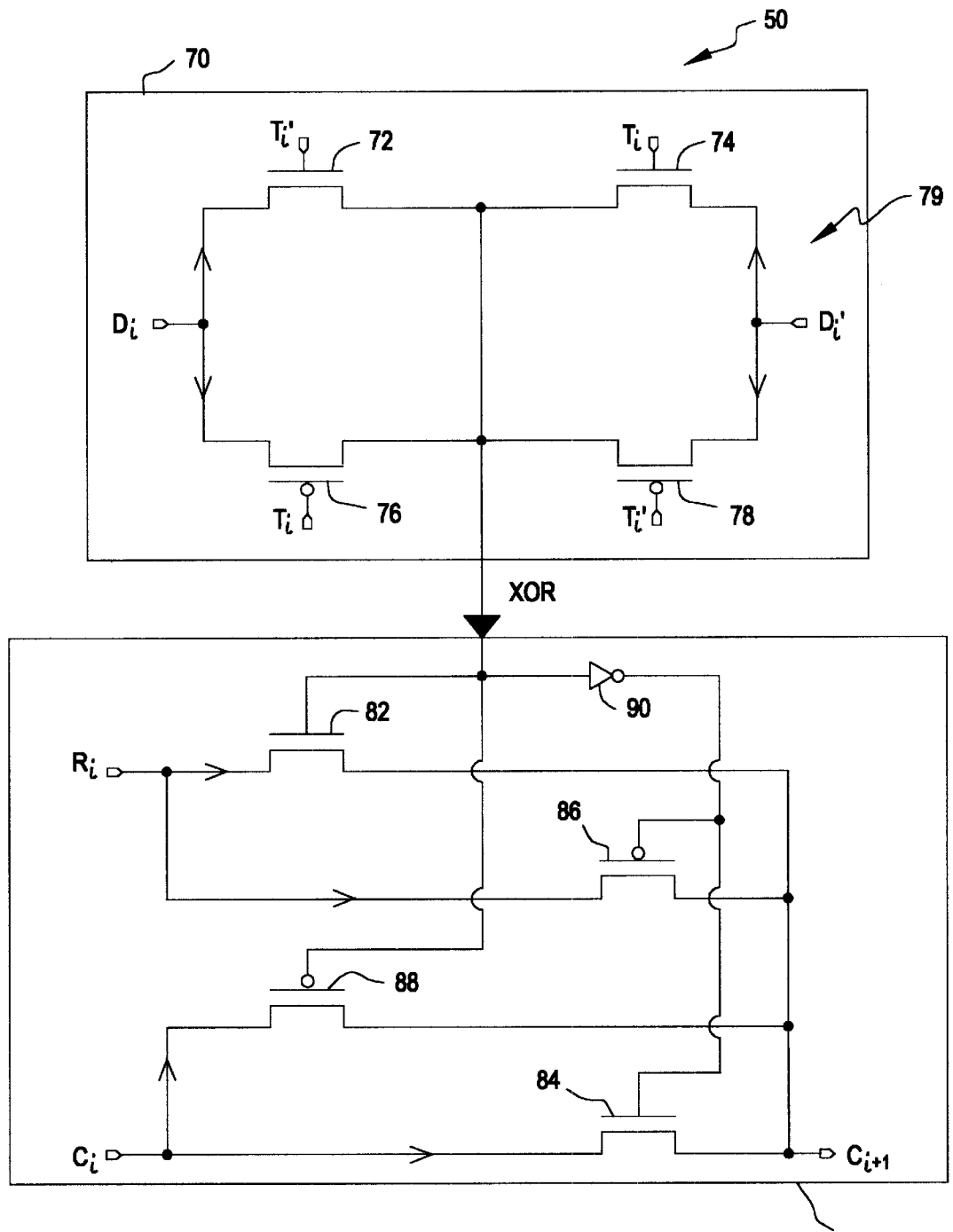
FIG. 2 is a schematic view of a relational logic circuit for the system of FIG. 1.

Digital data bus DI is coupled to content addressable memory 24. Data bus DI can be of a serial type, parallel type, or a combination of these, and can be of internal or external to IC 22. In one mode of operation, data bus DI provides a multibit input data word DW for comparison to the contents of one or more separately accessible memory locations 30 of memory 24. Each location 30 can be accessed by activation of a corresponding word line of content addressable memory 24 (not shown). In FIG. 2, only one representative content addressable memory location 30 is specifically depicted to preserve clarity. Other locations 30 of content addressable memory 24 would be disposed in a like manner (not shown).

Data word DW ranges from a least significant bit, D0, to a most significant bit, DN, having a total length of "N+1" bits. This range can also be designated by the notation [D0:DN] or the series D0, D1, . . . , DN. A bit of data word DW is also generally represented by $D_i$ where "i" is an integer index to the individual bits in the range of 0 to N. Each bit $D_i$ of data word DW is input to a corresponding one of inverters 32a, 32,b, . . . , and 32c (collectively designated inverters 32) to provide a complementary bit $D_i'$ as designated by a trailing apostrophe. Accordingly, the outputs of inverters 32 are represented by the series D0', D1', . . . , DN'.

Location 30 includes a number of CAM cells 40, a few of which are more specifically designated as CAM cells 40a, 40b, . . . , and 40c. Each complementary pair of bits $D_i$ and $D_i'$ for a given value "i" in the range 0 to N are input to a different CAM cell 40. For the depicted CAM cells 40a, 40b, and 40c; the input pairs D0 and D0', D1 and D1', and DN and DN'; respectively, are specifically shown in FIG. 1. Each CAM cell 40 provides an output of its stored bit contents in a true and complement forms as represented by T0 and T0' for CAM cell 40a; $T_i$ and $T_i'$ for CAM cell 40b, and TN and TN' for CAM cell 40c, respectively. The true and complement bits for a CAM cell 40 are also generally represented by $T_i$ and $T_i'$, where "i" is the integer index to the individual cells over the range from 0 (least significant bit location) to N (most significant bit location) as previously described in connection with data word DW true and complement bits $D_i$ and $D_i'$. In one embodiment, CAM cells 40 each correspond to a standard memory cell configuration having true and complement bit storage nodes, such as a six transistor (6T) Static Random Access Memory (SRAM) cell or a four transistor (4T) Dynamic Random Access Memory (DRAM) cell. In other embodiments, CAM cell 40 is of a twin-cell DRAM type, a combination of various cell types, and/or a different configuration as would occur to those skilled in the art.

For each CAM cell 40, the corresponding input bits $D_i$ and $D_i'$ from data bus DI and cell contents $T_i$ and $T_i'$ are provided to relational logic 50. Relational logic 50 includes a number of like configured logic circuits 52 a few of which are specifically designated as cell logic 52a, cell logic 52b, and cell logic 52c. The output bit of relational logic 50, COUT, provides a true or false indication for a specified relational comparison of the data word DW to the contents of CAM cells 40 of location 30. This relational operation is performed in a generally parallel, bit-by-bit manner between each of the $D_i$ bits of data word DW and each of the $T_i$ bits of location 30 as will be more fully described hereinafter.

Within relational logic 50, logic circuits 52 are connected by a series of relational signal pathways $C_i$ starting with CIN=C0 (i=0) at the left most extreme and ending with $C_i$=CN+1=COUT (i=N+1) at the right most extreme. In between these extremes, the intervening signal pathways $C_i$ correspond to the integer index "i" in the range from 1 to N, such that, for example, cell logic 52a is connected to cell logic 52b by $C_i$=C1 (i=1), and so on. Collectively, relational logic pathways $C_i$ provide a relational signal line RL. It should be understood that throughout FIG. 1, the ellipses represent the optional addition of one or more like sets of inverters 32, cells 40, logic circuits 52, and connecting signal pathways to add one or more bits as required to provide a desired bitwidth greater than the bitwidth of three illustrated. In other embodiments, a bitwidth of less than three can be provided by correspondingly deleting one or more of these sets.

Referring to FIG. 2, a representative logic circuit 52 of relational logic 50 is further illustrated for which the depicted data word DW inputs $D_i$ and $D_i'$; cell outputs $T_i$ and $T_i'$, and relational selection input $R_i$ represent each respective set of signals D0, D0', T0, T0', and R0; D1, D1', T1, T1', and R1;. . . ; and DN, DN', TN, TN', and RN for content addressable memory 24. Logic circuit 52 is repeated for each of the N+1 bits of data word DW and location 30. In other words, each cell logic 52a, 52b, . . . , and 52c is configured like logic circuit 52 depicted in FIG. 2.

Logic circuit 52 includes exclusive-or (XOR) logic 70 and inequality logic 80. Exclusive-or logic 70 includes four gate devices specifically designated as active-high gate devices 72 and 74 that are each activated by a logic high level of input bits $T_i'$ and $T_i$, respectively, and active-low gate devices 76 and 78 that are each activated by a logic low level of input bits $T_i$ and $T_i'$, respectively. As used herein, the active-low control of a gate device is distinguished from active-high control by a bubble input symbol. When activated, the corresponding gate devices 72, 74, 76, and 78 pass through its corresponding input designated by arrowheads in FIG. 2 to the common output node designated as output XOR. For gates 72 and 76, the selectable input is $D_i$, and for gates 74 and 78, the selectable input is $D_i'$. Correspondingly, the truth table (Table 1), for

TABLE 1

| $T_i$ | $D_i$ | XOR |
|---|---|---|
| Low | Low | Low |
| Low | High | High |
| High | Low | High |
| High | High | Low |

The output of exclusive-or logic 70, XOR, is input to inequality logic 80. Inequality logic 80 includes active-high gate devices 82 and 84; active-low gate devices 86 and 88; and inverter 90. The exclusive-or logic 70 output XOR is input to inverter 90 and controls gate devices 82 and 88. The output of inverter 90 (XOR') controls gate devices 84 and 86. Relational selection input $R_i$ is input to gate devices 82 and 86 as indicated by corresponding arrowheads. The incoming relational logic pathway $C_i$ is input to gate devices 84 and 88 as indicated by corresponding arrowheads. Gate devices 82, 84, 86, 86, and 88 all share a common output node represented by $C_{i+1}$. Because gate devices 82 and 86 are of opposite activation types and are triggered by complementary forms of the exclusive-or logic 70 output (XOR and XOR'), both gate devices 82 and 86 are active or inactive at the same time. For the illustrated configuration, gate devices 82 and 86 are active when XOR is low, correspondingly passing $R_i$ to $C_{i+1}$. Likewise, gate devices 84 and 88 are of opposite activation types and are both activated by the high state of XOR. As a result, exclusive-or logic 70 operates as selection logic (alternatively designated by reference numeral 79) to determine the signal that is routed to $C_{i+1}$ by inequality logic 80. Accordingly, the truth table (Table 2) for the operation of inequality logic 80 is illustrated as follows:

TABLE 2

| XOR | $C_{i+1}$ |
|---|---|
| Low | $C_i$ |
| High | $R_i$ |

Referring generally to FIGS. 1 and 2, the operation of relational logic 50 is next described. Relational logic 50 is arranged to provide a selected greater-than (>), greater-than-or-equal-to ($\geq$), less-than (<), or less-than-or-equal-to ($\leq$) inequality relational operation relative to $D_i$ and $T_i$; depending on the inputs $C_i$ and $R_i$. The result of the selected relational operation is provided through an active-high indication of COUT. More specifically, relational selection input $R_i$ for each logic circuit 52 determines whether a less-than or greater-than inequality operation will result and the CIN input to relational logic 50 determines whether an "or-equal" relation would be included with the selected less-than or greater-than relationship to correspondingly provide a less-than-or-equal-to or greater-than-or-equal-to operation.

CAM cell 40c and cell logic 52c correspond to the most significant bit of data word DW (DN) and location 30 (TN).

Accordingly, it should be understood that if the content of CAM cell 40c does not equal the respective data word DW input bit (TN≠DN), then there is enough information to determine the selected inequality state (greater-than or less-than) between the contents of location 30 and the input data word DW. Corresponding to this inequality, XOR for cell logic 52c will be set to a high logic level (XOR=1), such that gate devices 82 and 86 will be activated. With gate devices 82 and 86 activated, $R_i$=RN is passed to the output COUT, such that COUT=$C_{i+1}$=$R_i$=RN. By connecting DN to input RN (RN=DN), a less-than relational operation is realized (contents of location 30<data word DW) when (TN<DN), such that COUT=DN when XOR=1 for cell logic 50c. By connecting the complement of DN to RN (RN=DN'), a greater-than relational operation is realized (contents of location 30>data word DW) when (TN>DN), such that COUT=DN'when XOR=1 for cell logic 50c. For either TN <DN or TN>DN, the remaining lower order bits of data word DW and location 30 can be ignored.

However, if the most significant bits are equal (DN=TN), the determination of a relational inequality between data word DW and the contents of location 30 results in the consideration of the next highest order bits ($T_i$=TN-1 and $D_i$=DN-1). If TN-1 does not equal DN-1, then the corresponding relational selection input Ri is routed to $C_{i+1}$; where relational selection input $R_i$=$D_i$=DN-1 for a less-than operation (contents of location 30 <data word DW) and relational input selection input $R_{i=Di}$'=DN-1' for a greater-than operation (contents of location 30>data word DW) for the cell logic corresponding to the next most significant bit. Accordingly, the cell logic output ($C_{i+1}$) for the next most significant bit is input to cell logic 52c of the most significant bit as signal pathway $C_i$ and passed to COUT through activation of gate devices 84 and 88 by the most significant bit equality DN=TN. If the bits TN-1 and DN-1 are the same (TN-1=DN-1), then bits TN-2 and DN-2 are considered in a like manner, and so on, incrementally decreasing the order of the bits compared until unequal bits of the same order are found or all bits of data word DW and location 30 are determined to be equal.

If the least significant bits T0 and D0 are reached for comparison, then an "or-equal" form of relational operation is set with the input CIN=C0 (i=0). More specifically, if the all the bits of data word DW and location 30 are the same, then T0=D0, which corresponding activates gate devices 88 and 84 for cell logic 52a. As a result, the logic level of CIN is feed through all of logic circuits 52 to COUT (CIN=C0= C1=. . .=COUT). Accordingly, the relational function for relational logic 50 is selected in accordance with the following truth table (Table 3):

TABLE 3

| CIN | $R_i$ | COUT |
|---|---|---|
| Low | $D_i$ | > |
| Low | $D_i$' | < |
| High | $D_i$ | ≥ |
| High | $D_i$' | ≤ |

In one embodiment of logic circuit 52, the active-high gate devices 72, 74, 82, and 84 are each implemented by a n-type transistor operated in a switching mode (such as a NMOS variety of insulated gate field effect transistor (IGFET)) and the active-low gate devices 76, 78, 86, and 88 are each implemented by a p-type transistor operated in a witching mode (such as a PMOS variety of IGFET). In other embodiments, a different implementation of one or more of the gate devices 72, 74, 76, 78, 82, 84, 86, 88 can be utilized, one or more different device types can be utilized, and/or a different logic arrangement can be utilized to provide one or more of the operational features described in connection with logic circuit 52.

Also, it should be understood that the depicted arrangement of relational logic 50 need not include $V_T$ drops for an NMOS and PMOS IGFET implementation, permitting full rail-to-rail operation of exclusive-or logic 70 for each logic circuit 52, and generally facilitating use with low-voltage memory cell configurations. Further, for the relational line RL depicted, a "pass transistor" configuration can be utilized in an IGFET type of gate device implementation, for which it may be desired to buffer or redrive the line at periodic logic pathway intervals such as every three to five logic circuits 52, depending on desired device performance.

In other embodiments, further logic may be provided to facilitate external selection of the type of relational operation performed with relational logic 50. For example, a single selection signal S can be applied to control whether each $R_i$ is set to $D_i$ or $D_i$' within CAM device 24. In one such example, a two-input exclusive-or gate is included with each logic circuit 52 to drive the corresponding $R_i$. The respective $D_i$ provides one input to each of these exclusive-or gates, and the selection input S is commonly provided as the other input. As a result, the output of each of these exclusive-or gates is set to the corresponding $D_i$ bit when S is low (S=0) and is set to the corresponding $D_i$' bit when S is high (S=1). For this embodiment, a corresponding truth table (Table 4) follows:

TABLE 4

| CIN | S | COUT |
|---|---|---|
| Low | Low | > |
| Low | High | < |
| High | Low | ≥ |
| High | High | ≤ |

In further embodiments, a different logic arrangement could be used in lieu of some or all of components depicted as would occur to those of ordinary skill in the art. In an embodiment utilizing the depicted configuration, it should be appreciated that the CAM cell and exclusive-or logic can be readily provided from exiting HDL macros, and the repetitive inequality logic circuit 80 can be implemented in an ASIC device as a separate macro, minimizing the need to redesign existing CAM cell macros. Nonetheless in yet other embodiments, the relational CAM device 24 can be implemented in the form of two or more separate integrated circuits and/or other component types as would occur to those skilled in the art.

All publications and patent applications cited in this specification are herein incorporated by reference as if each individual publication or patent application were specifically and individually indicated to be incorporated by reference. Further, any theory, mechanism of operation, proof, or finding stated herein is meant to further enhance understanding of the present invention, and is not intended to limit the present invention in any way to such theory, mechanism of operation, proof, or finding. While the invention has been illustrated and described in detail in the drawings and foregoing description, the same is to be considered as illustrative and not restrictive in character, it being understood that only selected embodiments have been shown and described and that all equivalents, changes, and modifications that come within the spirit of the inventions as defined herein or by the following claims are desired to be protected.

What is claimed is:

1. An apparatus, comprising:

a number of content addressable memory cells;

a number of relational logic circuits each operable to compare a stored bit of a different one of said cells to a respective bit of a multibit input word, said relational logic circuits each include selection logic; and wherein for each respective one of said relational logic circuits, said selection logic is operable to route a first signal input to said respective one of said relational logic circuits to an output of said respective one of said relational logic circuits if the stored bit and the respective bit are equal, and said selection logic is operable to route a second signal representative of a relational inequality between the word and data stored in said cells to said output if the stored bit and the respective bit are unequal.

2. The apparatus of claim 1, wherein each one of said relational logic circuits are coupled to another of said relational logic circuits by a corresponding one of a number of signal pathways, and said relational logic circuits each include a device to selectively pass said first signal to said output in response to a comparison signal.

3. The apparatus of claim 1, wherein said second signal corresponds to said respective bit or a complement of said respective bit.

4. The apparatus of claim 1, wherein said selection logic includes an exclusive-or operator responsive to the respective bit and the stored bit of said different one of said cells.

5. The apparatus of claim 1, wherein one of said relational logic circuits corresponds to a least significant bit position and includes means for providing an or-equal form of an inequality relational operation with said relational logic circuits.

6. The apparatus of claim 1, wherein said second signal corresponds to a greater than or less-than form of relational comparison between the input word and the data.

7. The apparatus of claim 1, wherein an integrated circuit device includes said memory cells and said relational logic circuits.

8. An apparatus, comprising:

a number of content addressable memory cells;

a number of relational logic circuits each corresponding to a different one of said cells to perform a relational comparison between a multibit input word and data stored in said cells, said relational logic circuits each being coupled to another of said relational logic circuits by a corresponding one of a number of signal pathways, said relational logic circuits each including a device with an input coupled to one said pathways and an output coupled to another of said pathways to selectively pass a signal from said input to said output in response to a control signal.

9. The apparatus of claim 8, wherein said control signal for a respective one of said relational logic circuits is active if a stored bit for a corresponding one of said cells and a respective bit of the input are equal.

10. The apparatus of claim 9, wherein said relational logic circuits are each operable to provide a relational state equal to the respective bit or a complement of the respective bit if the stored bit and the respective bit are unequal.

11. The apparatus of claim 10, wherein said relational logic circuits each include exclusive-or logic to generate said control signal.

12. The apparatus of claim 8, wherein one of said relational logic circuits corresponds to a least significant bit position and includes means for providing an or-equal form of an inequality relational operation with said relational logic circuits.

13. The apparatus of claim 8, wherein an integrated circuit device includes said memory cells and said relational logic circuits.

14. A method, comprising:

operating a content addressable memory including a multibit storage location, first relational logic corresponding to a most significant bit of the location and second relational logic corresponding to a next most significant bit of the location;

providing a multibit input to the memory;

selecting a first signal for output with the first relational logic if a first bit of the input and a most significant bit of the location are different; and selecting a second signal for output with the first relational logic if the first bit of the input and the most significant bit of the location are equal, the second signal being received from the second relational logic.

15. The method of claim 14, wherein the first signal is equal to the first bit and corresponds to a less-than relation between the input and the location.

16. The method of claim 14, wherein the first signal is equal to the inverse of the first bit and corresponds to a greater-than relation between the input and the location.

17. The method of claim 14, further comprising:

generating a third signal with third relational logic if the first bit and the most significant bit are equal, the second bit and the next most significant bit are equal, and a third bit of the input and another bit of the location are unequal; and passing the third signal through the second relational logic to the first relational logic for output.

18. The method of claim 14, further comprising:

comparing a least significant bit of the location to a respective bit of the input;

if the least significant bit and the respective bit of the input are unequal, providing the respective bit or a complement of the respective bit to the first relational logic for output; and if the least significant bit and the respective bit are equal, providing an or-equal bit to the first relational logic for output.

19. A method, comprising:

providing a multibit input to a content addressable memory location;

generating a relational state bit output corresponding to an arithmetic relationship between the input and the memory location;

routing a first bit of the input or a complement of the first bit to the output if the first bit and a most significant bit of the location are unequal; and if the first bit and the most significant bit are equal, routing a second bit of the input or a complement of the second bit to the output if the second bit and a next most significant bit of the location are unequal.

20. The method of claim 19, further comprising routing a third bit of the input or a complement of the third bit to the output if the second bit and a next most significant bit are equal and the third bit and a respective bit of the location are unequal.

21. The method of claim 19, wherein said routing the first bit and said routing the second bit are performed by relational logic responsive to the input and the location contents.

22. The method of claim 21, wherein said relational logic is provided in the form of a number of logic circuits each responsive to a different one of a number of memory cells defining the memory location.

23. The method of claim 22, further comprising performing an exclusive-or operation with each respective one of the logic circuits to selectively pass a signal through the respective one of the logic circuits.

24. The method of claim 19, wherein said routing the first bit is performed in response to the input being less than the location.

25. The method of claim 19, wherein said routing the complement of the first bit is performed in response to the input being greater than the location.

26. The method of claim 19, further comprising comparing a least significant bit of the location to a corresponding bit of the input to route the least significant bit or a complement of the least significant bit to the output if the least significant bit and the corresponding bit are unequal and an or-equal inequality selection bit if the least significant bit and the corresponding bit are equal.

* * * * *